United States Patent [19]

Chan et al.

[11] Patent Number: 5,795,800
[45] Date of Patent: Aug. 18, 1998

[54] INTEGRATED CIRCUIT FABRICATION METHOD WITH BURIED OXIDE ISOLATION

[75] Inventors: Tsiu Chiu Chan, Carrollton; Artur P. Balasinski, Dallas, both of Tex.

[73] Assignee: SGS-Thomson Microelectronics, Inc., Carrollton, Tex.

[21] Appl. No.: 686,395

[22] Filed: Jul. 25, 1996

Related U.S. Application Data

[62] Division of Ser. No. 478,247, Jun. 7, 1995.

[51] Int. Cl.$^6$ .................................................. H01L 21/00
[52] U.S. Cl. ...................... 438/149; 438/199; 438/238; 438/520; 438/526
[58] Field of Search ............... 437/21, 26; 438/149, 438/370, 526, 953, 766, 199, 238, 520

[56] References Cited

U.S. PATENT DOCUMENTS

| 4,700,454 | 10/1987 | Baerg et al. | 437/24 |
| 5,338,965 | 8/1994 | Malhi | 257/347 |
| 5,422,296 | 6/1995 | Lage | 437/52 |

FOREIGN PATENT DOCUMENTS

| 4345064 | 12/1992 | Japan. |
| 5283699 | 10/1993 | Japan. |

OTHER PUBLICATIONS

Stoemenas, "Silicon on Insulator Obtained by High Dose Oxygen Implantation, Microstructure, and Formation Mechanism," 142 J. Electrochem. Soc. 1248 (1995).

Sano, et al., "High Quality $SiO_2$/Si Interfaces of Poly-Crystalline Silicon Thin Film Transitor by Annealing In Wet Atsmophere," 157 IEEE Electron Device Letters, vol. 16, No. 5 (1995).

Hervé, et al., "SOI Substrate for Low-Power LSIs," 87 Solid State Technology (1995).

*Primary Examiner*—Jey Tsai
*Attorney, Agent, or Firm*—Theodore E. Galanthay; Lisa K. Jorgenson; Peter J. Thoma

[57] ABSTRACT

A CMOS SRAM cell in which a patterned SIMOX layer forms a buried oxide beneath the PMOS devices, but not beneath the NMOS devices. Latchup is impossible, and well diffusions are not needed.

25 Claims, 4 Drawing Sheets

INTEGRATED CIRCUIT FABRICATION METHOD WITH BURIED OXIDE ISOLATION

This is a Division of application Ser. No. 08/478,247, filed Jun. 7, 1995.

BACKGROUND AND SUMMARY OF THE INVENTION

The present inventions relate to integrated circuit devices and processes, and particularly to CMOS devices and processes which are highly resistant to latchup.

One of the important limitations to the scaling down of Complementary MOS (CMOS) devices is the design rule for the NMOS-to-PMOS spacing. While all other circuit design rules for the current technology are well below 1 μm, the design rule for NMOS-to-PMOS spacing is still typically in the neighborhood of 2–3 micrometers. This rule originates from the need of separate deep implantation of the n- and p-type dopants followed by a drive-in. The lateral distribution of the dopant makes the transition region between the n-well and the p-well very wide, and no active devices can be built there. For that reason, placing small and repetitive elements of CMOS circuitry such as memory cells next to each other requires a large amount of area, and is usually avoided if possible. However, such placement may become indispensable for certain applications such as zero-power SRAM devices.

Latchup considerations also place some limitations on n+ to p+ spacing in bulk CMOS technologies. Latchup is one of the basic problems of CMOS technology. Consider the sequence of a PMOS source region, the surrounding N-well region, a p-well region (or p-type epitaxial layer), and an NMOS source region. This sequence of regions will inevitably occur in normal bulk CMOS designs, and it defines a thyristor. This thyristor is referred to as "parasitic," since it is not created intentionally. A thyristor is a bipolar device which has an extremely low on-resistance. Once the thyristor turns on (or "fires"), it will remain on for as long as it can draw its minimum holding current. This behavior is extremely undesirable in integrated circuits, since when such a parasitic thyristor fires it may destroy the integrated circuit (by drawing excessive current), or may rapidly discharge a portable system's battery, or may simply cause the chip to remain in a "stuck" condition, and hence become unusable, until the power supply is disconnected.

An SRAM cell consists typically of two n-channel pass transistors (which selectably connect the cell latch to a pair of bit-lines), two cross-coupled n-channel driver transistors, and two more active or passive devices acting as the load (or pull-up) devices. Ordinarily, the parameters of these pull-ups are non-critical, and they can be made of material with relatively poor electrical properties, such as polysilicon. In this case the pull-ups can be stacked on top of the n-channel MOSFETs (which have their channels in the monocrystalline substrate). This ensures that the cell area is kept to a minimum, while the n-MOSFETs still have the necessary quality. One of the drawbacks of this approach is the relatively high leakage current of the cell and its high temperature coefficient; but this is not a critical drawback in commodity SRAM specifications.

In "zero-power" applications the information in an SRAM cell must be retained for an extended period (e.g. 10 years) while sustained only by a small battery. For such applications it is important that the leakage of the SRAM cell be minimal. Thus, such applications usually form the PMOS pull-up devices in the substrate, but this means the NMOS-to-PMOS spacing rules degrade density. For this reason the density of zero-power SRAM cells is only about half that of mainstream commodity SRAMs.

One possible way to bypass the need for wells is to build one of the device types as an SOI (silicon-on-insulator) structure. This avoids the need for NMOS-to-PMOS design rules. One such architecture is described in commonly-owned prior application 08/397,654 filed Feb. 28, 1995 (and now pending), which is hereby incorporated by reference.

The present application is intended to provide improvements over the approach described in the 08/397,654 application, including improved topography, avoidance of the need for selective epitaxy and/or recrystallization of polysilicon, and avoidance of excessive oxide growth steps.

The present application discloses a memory cell process in which a patterned buried oxide layer is formed under the PMOS devices by a high-dose high-energy oxygen implant. A hardmask screens this implant from the NMOS device areas. After a high-temperature anneal, the patterned oxygen implant provides a buried oxide layer. This provides dielectric isolation under the PMOS devices, and thus: avoids NMOS-to-PMOS spacing rules;

reduces leakage as compared to thin-film transistors; and makes latchup impossible.

BRIEF DESCRIPTION OF THE DRAWING

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

Figure 1:
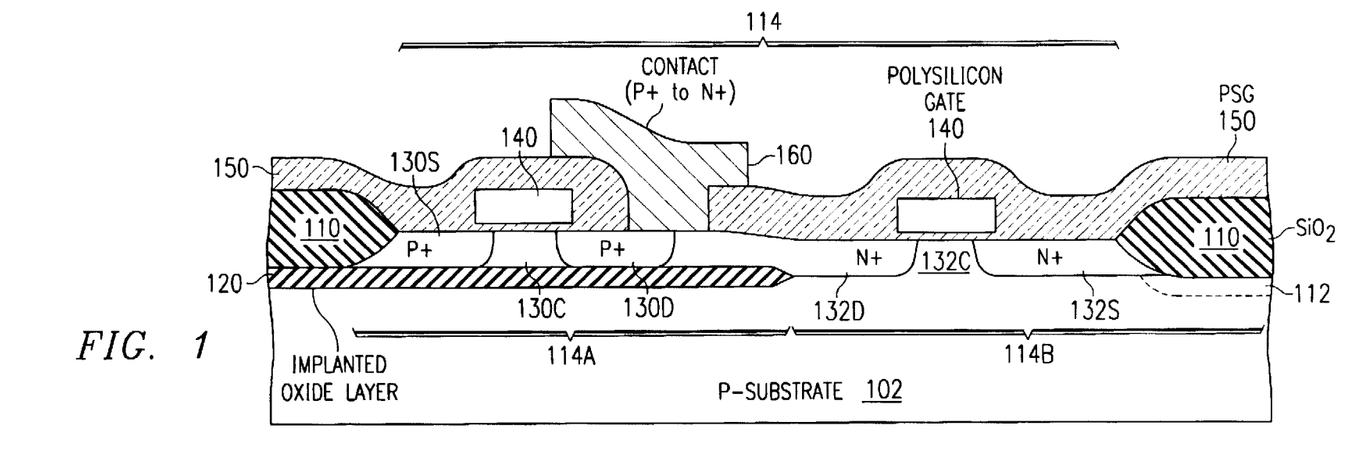
FIG. 1 is a sectional view of a sample CMOS structure according to the disclosed inventions.

The numerous innovative teachings of the present application will be described with particular reference to the presently preferred embodiment (by way of example, and not of limitation), in which:

FIG. 1 is a sectional view of a sample CMOS structure according to the disclosed inventions.

A p-type substrate 102 contains areas of thick field oxide 110 (e.g. 4000–5000 Å thick) which define active device areas 114 therebetween. At least some areas of the field oxide 110 optionally overlie a conventional channel stop implant 112, but this is not necessarily present in all embodiments.

The active device regions include first portions 114A, which the surface monocrystalline portion overlies a buried oxide layer 120, and second portions 114B in which the surface monocrystalline portion does not overlie the buried oxide layer 120.

The first active portions 114A include PMOS devices, of which a representative one is shown. The illustrated PMOS device includes a P+ source diffusion 130S and a P+ drain diffusion 130D, separated by an N- channel region 130C. Note that all of these regions overlie the buried oxide layer 120.

The second active portions 114B include NMOS devices, of which a representative one is shown. The illustrated NMOS device includes an N+ source diffusion 132S and an N+ drain diffusion 132D, separated by a P- channel region 132C. Note that all of these regions overlie the p-type substrate 102.

The PMOS and NMOS devices both have insulated gates which (in this embodiment) are formed from a thin-film polysilicon layer 140. (Alternatively, of course, this could be a polycide layer, or the PMOS and NMOS gates can be formed from separate thin-film layers.)

A passivation layer 150 overlies the transistor structures, except where patterned contact holes permit a patterned thin-film metal layer 160 to contact the polysilicon 140 or the active area 114. (Alternatively the layer 160 can also be polysilicon or silicide, with additional patterned conductor layers being formed in metal.)

Note that in the structure shown the two drain regions 132D and 130D abut each other, and metal layer 160 makes contact to both drain regions. This is convenient for CMOS output nodes, including the two data storage nodes of an SRAM cell.

FIGS. 2A–2E show sequential steps in fabricating the structure of FIG. 1.

Figure 2A:
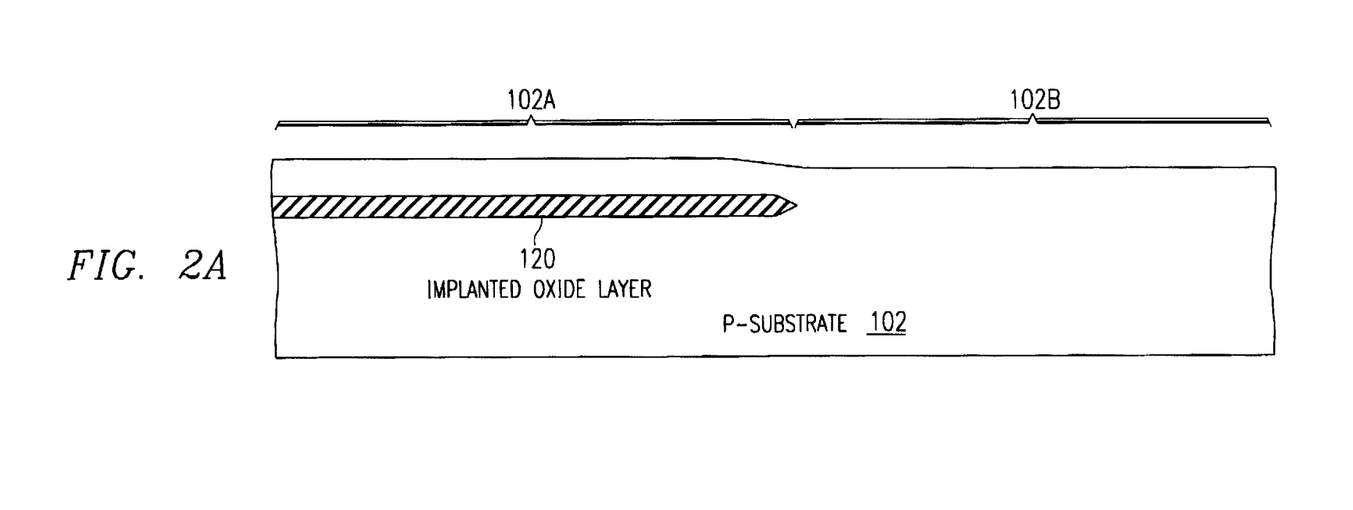
FIGS. 2A–2E show sequential steps in fabricating the structure of FIG. 1.

Initially a p-type silicon substrate 102 is cleaned up, and a hardmask is formed and patterned. The hardmask covers area 102B and exposes area 102A. The hardmask itself may be, e.g., 3000 Å of low-temperature plasma oxide (or alternatively aluminum) over 2000 Å of polyimide. (Of course a photoresist layer is also used to pattern the hardmask.)

At this point an optional screen oxide can then be grown (or deposited) over the silicon surface, e.g. to 500 Å thickness, to reduce the depth of the buried oxide layer. Preferably the depth of the buried oxide layer is comparable to or less than the minimum achievable activated p+ source/drain junction depth, to minimize leakage. Similarly, the buried oxide formation process is preferably adjusted to minimize the density of implantation-induced defects, as described in the literature cited above.

An oxygen implant is then performed (e.g. with $1.8 \times 10^{18}$ cm$^{-2}$ of oxygen ions at 190 keV).

After implantation the hardmask is stripped (e.g. by liftoff), and a high-temperature anneal is then performed, e.g. 360 minutes at 1320° C. This produces the buried oxide layer 120 shown on the left side of FIG. 2A. The screen oxide layer (if any) can then be stripped. The implant energy and the thickness of the sacrificial surface oxide layer are selected to provide a thickness, in region 114A over buried oxide 120, of e.g. 10000 Å. (Alternatively this thickness can be anywhere in the range from 200–3000 Å; smaller thicknesses tend to reduce topology, and are hence preferable.) Note that the silicon surface on the left side (area 102A) shows a slight volumetric expansion. These steps result in the structure of FIG. 2A.

Figure 2B:
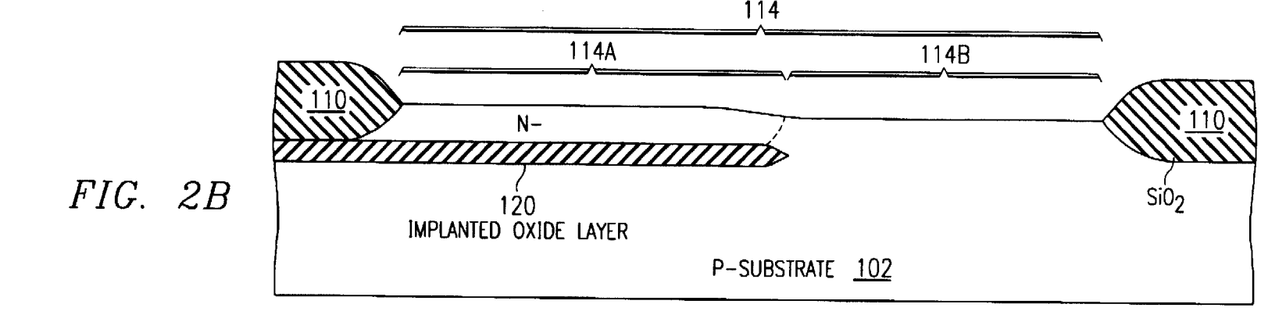
Figure 2C:
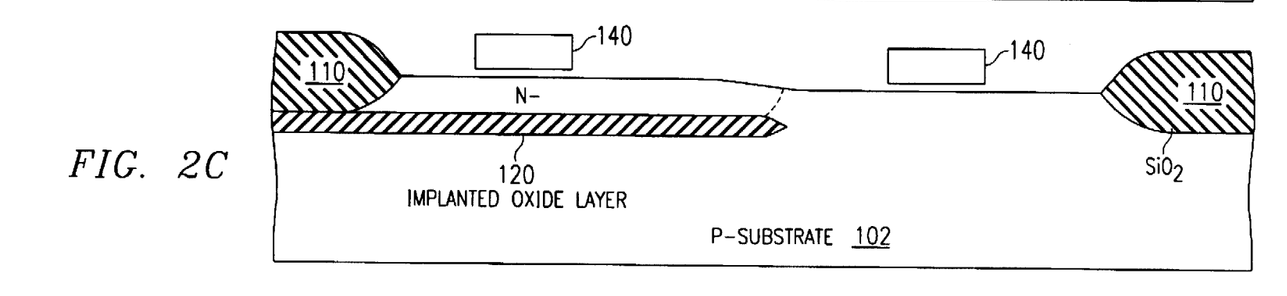
Figure 2D:
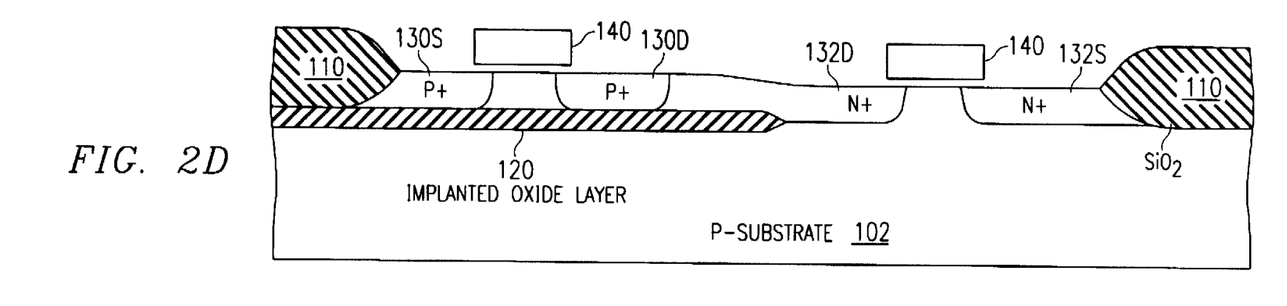
Figure 2E:
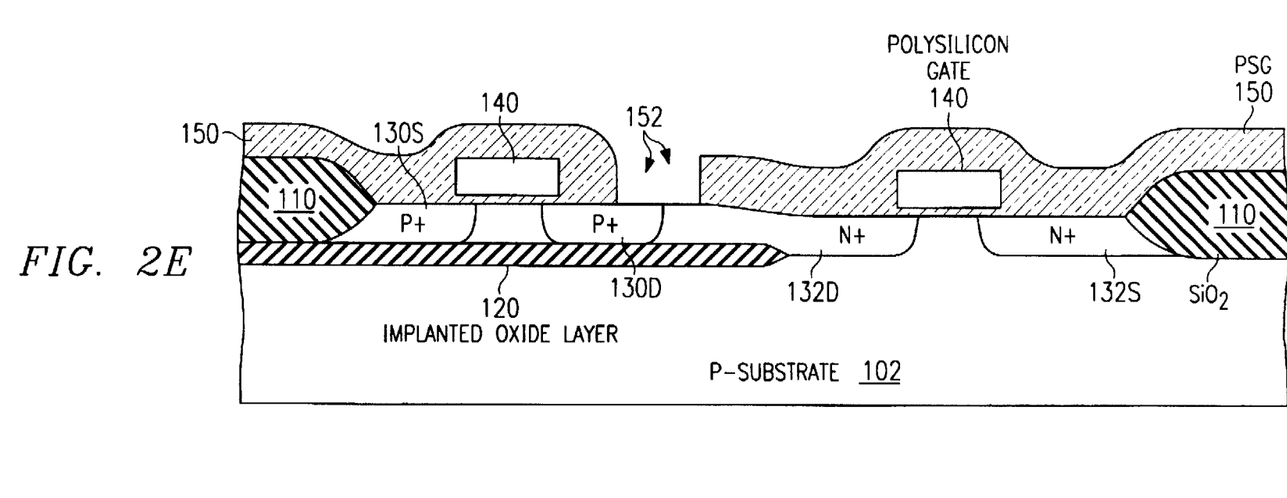

A LOCOS stack is now formed and patterned to cover active device areas 114. A channel stop implant is now optionally performed, e.g. $10_{13}$–$10_{14}$ cm$^{-2}$ of boron at 50 keV. Field oxide 110 is then grown (e.g. to 5000 Å thickness). Note, however, that thickness of the field oxide 110 must be sufficient to extend down to the buried oxide 120, in order to provide dielectric isolation around the source regions. The LOCOS stack is then stripped.

A masked implant into regions 114A is now performed, to turn the crystalline silicon in this area n-type (lightly doped).

In a sample embodiment, this implant is $10_{13}$–$10_{14}$ cm$^{-2}$ of phosphorus at 35 keV. (This implant may be performed using multiple steps at different energies, to obtain the desired vertical dopant profile.) Note that this implant is not required to be wholly coincident with the PMOS active areas 114, so this implant can be used to create lateral diodes if desired.

A masked or blanket VT implant can also optionally be performed at this point, to adjust the threshold voltage of the NMOS devices.

These steps result in the structure of FIG. 2B. Note that one part 114A of the active area 114 overlies the buried oxide 120, while another part 114B does not.

A sacrificial oxide is now grown and stripped, a gate oxide is grown, and a polysilicon layer 140 is deposited and patterned. These steps result in the structure of FIG. 2C.

Thereafter, a masked N+ implant is used to form the N+ sources 132S and drains 132D, and a masked P+ implant is used to form the P+ sources 130S and drains 130D. (These are self-aligned to the gate layer 140, or may optionally be self-aligned to optional sidewall spacers on the gate layer 140.) These steps result in the structure of FIG. 2D.

Thereafter an interlevel dielectric 150 is deposited, e.g. 3000 Å of BPSG over 800 Å of TEOS-deposited undoped oxide. The dielectric 150 is then patterned and etched to form contact holes 152, and thereafter can optionally be reflowed. These steps result in the structure of FIG. 2E.

Thereafter, a thin-film metal layer is deposited, patterned and etched to form the structure of FIG. 1. Processing concludes with conventional steps, such as deposition and patterning a further interlevel dielectric, second metal, and protective overcoat.

Figure 3:
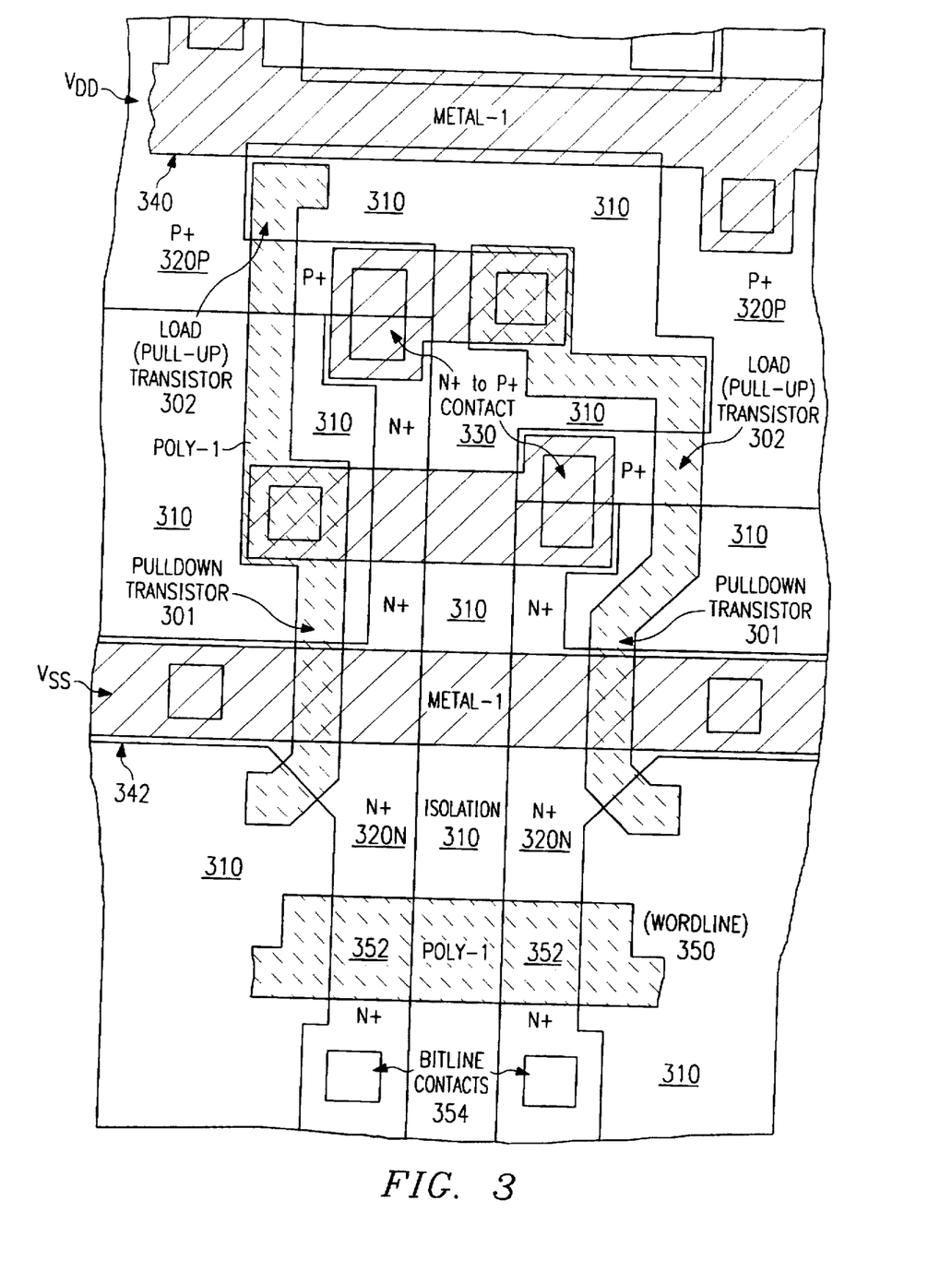
FIG. 3 shows a layout of a sample zero-power 6T SRAM cell.

FIG. 3 shows a layout of a sample zero-power 6T SRAM cell. Two NMOS pull-down transistors 301 are loaded by two PMOS pull-up transistors 302. The active areas are separated by field oxide (isolation) areas 310. Masked p and n implants dope the active areas to form (where poly-1 is not present) p+ source/drain regions 320P and n+ source/drain regions 320N. The sources of PMOS transistors 302 are supplied by positive supply voltage $V_{DD}$ which is routed through metal line 340, and the sources of NMOS transistors 301 are supplied by ground voltage $V_{ss}$ which is routed through metal line 342. The drains of PMOS transistors 302 are ohmically connected to the drains of NMOS transistors 301 at merged contact locations 330. Each of these merged contact locations 330 corresponds to one of the data nodes of the cell, and is accessible through a pass transistor 352 (gated by word line 350 to provide connections to bitline contacts 354). Note that a short metal jumper connects each of these merged contact locations 330 to the polysilicon gate lines of the transistors which drive the merged contact at the opposite node of the cell.

Figure 4:
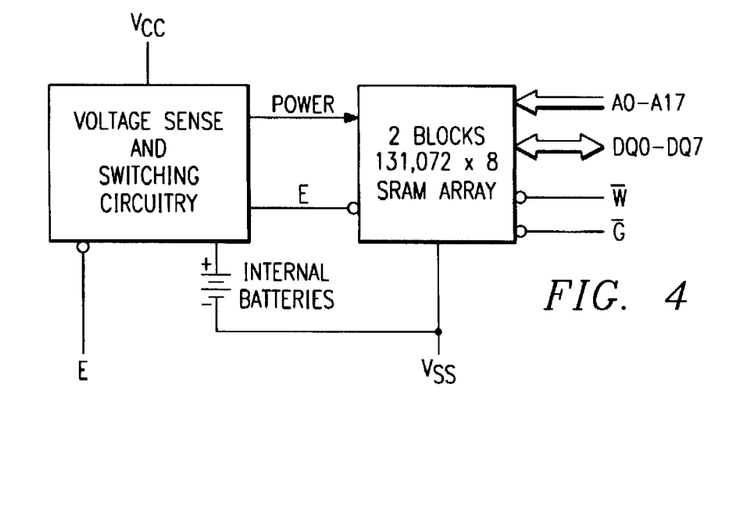
FIG. 4 shows a sample zero-power SRAM memory.

FIG. 4 shows a sample zero-power SRAM memory. The illustrated example is the M48Z256/256Y memory, which is commercially available from SGS-Thomson, but of course the disclosed cell architecture can be used in other modules and chips too, and the specific illustrated module and chip architecture does not delimit the claimed inventions.

Notable features of this module include:

It is an integrated module which combines low power SRAMs, power-fail control circuit, and batteries.

It provides conventional SRAM operation, with unlimited write cycles.

It provides 10 years of data retention in the absence of power.

It provides pin and function compatible with jedec standard 256k×8 SRAMs.

It provides automatic power-fail chip deselect and write protection.

It provides a choice of two write protect voltages:
in version M48Z256: 4.5 V≤$V_{PFD}$≤4.75 V; or
in version M48Z256Y: 4.2 V≤$V_{PFD}$≤4.50 V.

Its batteries are internally isolated until power is applied.

The M48Z256/256Y×8 ZEROPOWER RAM is a nonvolatile 2,097,152 bit Static Ram organized as 262,144 words by 8 bits. The device combines two internal lithium batteries and full CMOS SRAMs in a plastic 32 pin DIP long Module.

The ZEROPOWER RAM directly replaces industry standard SRAMs. It also fits into many EPROM and EEPROM sockets, providing the nonvolatility of PROMs without any requirement for special write timing or limitations on the number or writes that can be performed.

The M48Z256/256Y has its own Power-fail Defect Circuit. The control circuitry constantly monitors the single 5V supply for an out of tolerance condition. When $V_{CC}$ is out of tolerance, the circuit wire protects the SRAM, providing a high degree of data security in the midst of unpredictable system operations brought on by low $V_{CC}$. As $V_{CC}$ falls below approximately 3V, the control circuitry connects the batteries which sustain data until valid power returns.

The M48Z256/256Y is in the Read Mode whenever W(White Enable) is high and E(Chip Enable) is low. The device architecture allows ripple-through access of data from eight of 2,097,152 locations in the state storage array. Thus, the unique address specified by the 18 Address Inputs defines which one of the 262,144 bytes of data is to be accessed. Valid data will be available at the Data I/O pins within $t_{AVOV}$ (Address Access Time) after the last address input signal is stable, providing that the E\ and G\ (Output Enable) access times are also satisfied. If the E\ and G\ access times are not met, valid data will be available after the later of Chip Enable Access Time ($t_{ELOV}$) or Output Enable Access Time ($t_{GLOV}$).

The state of the eight three-state Data I/O signals is controlled by E\ and G\. If the outputs are activated before $t_{AVOV}$, the data lines will be driven to an indeterminate state until $t_{AVOV}$. If the Address Inputs are changed while E\ and G\ remain low, output data will remain valid for $t_{AXOX}$ (Output Data Hold Time) but will go indeterminate until the next Address Access.

The M48Z256/256Y is in the Write Mode whenever W and E are active. The start of a write is referenced from the latter occurring falling edge of W\ or E\. A write is terminated by the earlier rising edge of W\ or E\.

According to a disclosed class of innovative embodiments, there is provided: An integrated circuit device structure, comprising: a first field-effect transistor, having source and drain diffusions of a first conductivity type located in and defining a channel region therebetween in a first monocrystalline semiconductor region; and a second field-effect transistor, having source and drain diffusions of a second conductivity type located in and defining a channel region therebetween in a second monocrystalline semiconductor region; wherein said first and second regions are both lattice-matched to an underlying monocrystalline semiconductor substrate; and wherein said second region, but not said first region, is separated from said substrate by a buried dielectric layer having a compositional profile characteristic of implantation of an oxidizing species followed by annealing.

According to another disclosed class of innovative embodiments, there is provided: An integrated circuit inverter structure, comprising: a first field-effect transistor, having source and drain diffusions of a first conductivity type located in and defining a channel region therebetween in a first monocrystalline semiconductor region; and a second field-effect transistor, having source and drain diffusions of a second conductivity type located in and defining a channel region therebetween in a second monocrystalline semiconductor region; wherein said first and second regions are both lattice-matched to an underlying monocrystalline semiconductor substrate; and wherein said second region, but not said first region, is separated from said substrate by a buried dielectric layer; and wherein said first and second transistors have respective insulated gates which are connected together, and have said respective drain diffusions connected together at a shared contact location.

According to another disclosed class of innovative embodiments, there is provided: An integrated circuit latch structure, comprising: first and third field-effect transistors, having source and drain diffusions of a first conductivity type located in and defining a channel region therebetween in a first monocrystalline semiconductor region; and second and fourth field-effect transistors, having source and drain diffusions of a second conductivity type located in and defining a channel region therebetween in a second monocrystalline semiconductor region; wherein said first and second regions are both lattice-matched to an underlying monocrystalline semiconductor substrate, and said second region, but not said first region, is separated from said substrate by a buried dielectric layer; and wherein said first and second transistors have said respective drain diffusions connected together at a shared contact location, and are interconnected with said third and fourth transistors to form a latch.

According to another disclosed class of innovative embodiments, there is provided: An integrated circuit SRAM cell structure, comprising: first and third field-effect transistors, having source and drain diffusions of a first conductivity type located in and defining a channel region therebetween in a first monocrystalline semiconductor region; and second and fourth field-effect transistors, having source and drain diffusions of a second conductivity type located in and defining a channel region therebetween in a second monocrystalline semiconductor region; wherein said first and second regions are both lattice matched to an underlying monocrystalline semiconductor substrate, and said second region, but not said first region, is separated from said substrate by a buried dielectric layer; and wherein said first and second transistors have said respective drain diffusions connected together at a shared contact location, and are interconnected with said third and fourth transistors to form a latch; and further comprising an additional transistor which is connected to provide selectable access to said shared contact location.

According to another disclosed class of innovative embodiments, there is provided: An SRAM memory, comprising: an array of memory cells arranged in rows and columns; address decoding circuitry, connected to receive address signals and accordingly provide decoded address outputs; and row and column selection circuitry, connected to access ones of said cells in accordance with said decoded address outputs; wherein multiple individual ones of said cells each comprise two first-conductivity-type field-effect transistors having source and drain diffusions located in and defining a channel region therebetween in a first monocrystalline semiconductor region; and two second-conductivity-type field-effect transistors having source and drain diffusions located in and defining a channel region therebetween in a second monocrystalline semiconductor region; wherein said first and second regions are both lattice-matched to an underlying monocrystalline semiconductor substrate, and wherein said second region, but not said first region, is separated from said substrate by a buried dielectric layer; said transistors being interconnected to form a latch.

According to another disclosed class of innovative embodiments, there is provided: An integrated circuit fabrication method, comprising the steps of: providing substantially monolithic semiconductor material; selectively forming a buried dielectric layer which underlies first, but not second, monocrystalline portions of said semiconductor material; forming field effect transistors of a first conductivity type in said first monocrystalline portions; and forming field effect transistors of a second conductivity type in said second monocrystalline portions.

According to another disclosed class of innovative embodiments, there is provided: An integrated circuit fabrication method, comprising the steps of: providing substantially monolithic semiconductor material; masking a portion of said semiconductor material, and implanting an unmasked portion of said semiconductor material with an oxidizing species at a dose greater than $10^{17}$ cm$^{-2}$; annealing said semiconductor material under conditions which cause said oxidizing species to react with said semiconductor material to thereby form a buried dielectric layer; forming field dielectric regions to separate portions of said semiconductor material, wherein said field dielectric regions define active areas of said semiconductor material therebetween; said field dielectric regions extending down into said semiconductor material at least to the depth of said buried dielectric layer; forming first-conductivity-type transistors in ones of said active areas which overlie portions of said buried dielectric layer; and forming transistors of a second conductivity type in ones of said active areas which do not overlie portions of said buried dielectric layer.

According to another disclosed class of innovative embodiments, there is provided: An integrated circuit fabrication method, comprising the steps of: providing substantially monolithic semiconductor material; masking a portion of said semiconductor material, and implanting an unmasked portion of said semiconductor material with an oxidizing species at a dose greater than $10^{17}$ cm$^{-2}$; annealing said semiconductor material under conditions which cause said oxidizing species to react with said semiconductor material to thereby form a buried dielectric layer; forming field dielectric regions to separate portions of said semiconductor material, wherein said field dielectric regions define active areas of said semiconductor material therebetween; said field dielectric regions extending down into said semiconductor material at least to the depth of said buried dielectric layer; forming first transistors, which have respective source and drain regions of a first conductivity type, in ones of said active areas which overlie portions of said buried dielectric layer; and forming second transistors, which have respective source and drain regions of a second conductivity type, in ones of said active areas which do not overlie portions of said buried dielectric layer; wherein at least some drain regions of said second transistors abut drain region regions of said first transistors at ohmic contact locations.

Modifications and Variations

As will be recognized by those skilled in the art, the innovative concepts described in the present application can be modified and varied over a tremendous range of applications, and accordingly the scope of patented subject matter is not limited by any of the specific exemplary teachings given. For example, as will be obvious to those of ordinary skill in the art, other circuit elements can be added to, or substituted into, the specific circuit topologies shown.

What is claimed is:

1. An integrated circuit fabrication method, comprising the steps of:
   (a.) providing substantially monolithic semiconductor material having an upper surface;
   (b.) selectively forming a buried dielectric layer beneath said upper surface and underlying first, but not second, monocrystalline portions of said semiconductor material;
   (c.) introducing dopants of a first conductivity type into said first monocrystalline portions to form source and drain regions of field effect transistors of a first conductivity type in said first monocrystalline portions, said source and drain regions extending entirely through said first monocrystalline portions to abut said buried dielectric layer; and
   (d.) introducing dopants of a second conductivity type into said second monocrystalline portions to form source and drain regions of field effect transistors of a second conductivity type in said second monocrystalline portions.

2. The method of claim 1, wherein said buried dielectric layer is formed by implantation of an oxidizing species followed by annealing.

3. The method of claim 1, wherein said buried dielectric is a buried oxide.

4. The method of claim 1, wherein said first conductivity type is P type and said second conductivity type is N type, whereby PMOS field effect transistors are formed in said first monocrystalline portions and NMOS transistors are formed in said second monocrystalline portions.

5. The method of claim 1, wherein said semiconductor material is silicon.

6. The method of claim 1, wherein all said transistors are insulated-gate field-effect transistors.

7. The method of claim 2 wherein said implanting step uses an ion implantation energy of at least about 100 keV.

8. The method of claim 1, wherein said semiconductor material is silicon, and said buried dielectric is a buried layer of silicon oxide.

9. The method of claim 1, further comprising the additional step, after said step (b.), of forming field dielectric regions to separate portions of said semiconductor material, wherein said field dielectric regions define active areas of said semiconductor material therebetween; said field dielectric regions extending down into said semiconductor material at least to the depth of said buried dielectric later; and wherein the portion of the monolithic semiconductor material immediately beneath said buried dielectric layer is entirely of the first conductivity type.

10. An integrated circuit fabrication method, comprising the steps of:
   (a.) providing substantially monolithic semiconductor material;
   (b.) masking a portion of said semiconductor material, and implanting an unmasked portion of said semiconductor material with an oxidizing species at a dose greater than $10^{17}$ cm$^{-2}$;
   (c.) annealing said semiconductor material under conditions that cause said oxidizing species to react with said semiconductor material to thereby form a buried dielectric layer;
   (d.) forming field dielectric regions to separate portions of said semiconductor material, wherein said field dielectric regions define active areas of said semiconductor material therebetween; said field dielectric regions extending down into said semiconductor material at least to the depth of said buried dielectric layer;

(e.) forming lateral PMOS transistors with source and drain regions that entirely overlie and extend down to the depth of said buried dielectric layer; and (f.) forming lateral NMOS transistors with source and drain regions in portions of said active areas that do not overlie said buried dielectric layer, wherein pairs of PMOS and NMOS transistors are arranged in common active areas, the drains of each transistor pair being connected at a PN junction above said buried dielectric layer.

11. The method of claim 10, wherein all said transistors are self-aligned insulated-gate field-effect transistors.

12. The method of claim 10, wherein said implanting step uses an ion energy of at least about 100 keV.

13. The method of claim 10, wherein said masking step uses at least one patterned inorganic masking layer.

14. The method of claim 10, wherein said buried dielectric is a buried oxide.

15. The method of claim 10, wherein said lateral PMOS transistors are each formed in a layer of N type material over said buried dielectric layer, and the source and drain regions of each of said lateral PMOS transistors extend entirely through said layer of N type material to abut said buried dielectric layer.

16. The method of claim 10, wherein said semiconductor material is silicon.

17. The method of claim 10, wherein said semiconductor material is silicon, and said buried dielectric is a buried layer of silicon oxide.

18. An integrated circuit fabrication method, comprising the steps of:

(a.) providing substantially monolithic semiconductor material;

(b.) masking a portion of said semiconductor material, and implanting an unmasked portion of said semiconductor material with an oxidizing species at a dose greater than $10^{17}$ cm$^{-2}$;

(c.) annealing said semiconductor material under conditions that cause said oxidizing species to react with said semiconductor material to thereby form a buried dielectric layer;

(d.) forming field dielectric regions to separate portions of said semiconductor material, wherein said field dielectric regions define active areas of said semiconductor material therebetween; said field dielectric regions extending down into said semiconductor material at least to the depth of said buried dielectric layer;

(e.) forming first transistors, each having source and drain regions of a first conductivity type, said source and drain regions extending entirely through said monolithic semiconductor material to abut said buried dielectric layer; and (f.) forming second transistors, each having source and drain regions of a second conductivity type, said active areas including pairs of first and second transistors connected to form SRAM memory cells, wherein said first transistor of each pair entirely overlies said buried dielectric layer and said second transistor of each pair is substantially laterally removed from over said buried dielectric layer;

wherein at least some drain regions of said second transistors abut drain region regions of said first transistors at ohmic contact locations.

19. The method of claim 18, wherein said buried dielectric is a buried oxide.

20. The method of claim 18, wherein said first conductivity type is P type and said second conductivity type is N type.

21. The method of claim 18, wherein said semiconductor material is silicon.

22. The method of claim 18, wherein all said transistors are self-aligned insulated-gate field-effect transistors.

23. The method of claim 18, wherein said implanting step uses an ion energy of at least about 100 keV.

24. The method of claim 18, wherein said semiconductor material is silicon, and said buried dielectric is a buried layer of silicon oxide.

25. The method of claim 18, wherein said first and second transistors of each pair have their drain regions adjoin to form PN junctions above said buried dielectric layer.

* * * * *

US005795800B1

REEXAMINATION CERTIFICATE (4027th)

United States Patent [19]
Chan et al.

[11] B1 5,795,800
[45] Certificate Issued Mar. 28, 2000

[54] INTEGRATED CIRCUIT FABRICATION METHOD WITH BURIED OXIDE ISOLATION

[75] Inventors: Tsiu Chiu Chan, Carrollton; Artur P. Balasinski, Dallas, both of Tex.

[73] Assignee: SGS-Thomson Microelectronics, Inc., Carrollton, Tex.

Reexamination Request:
No. 90/005,298, Mar. 19, 1999

Reexamination Certificate for:
Patent No.: 5,795,800
Issued: Aug. 18, 1998
Appl. No.: 08/686,395
Filed: Jul. 25, 1996

Related U.S. Application Data

[62] Division of application No. 08/478,247, Jun. 7, 1995.

[51] Int. Cl.[7] .................................................. H01L 21/00

[52] U.S. Cl. ...................... 438/149; 438/199; 438/238; 438/520; 438/526

[58] Field of Search ..................................... 438/149, 199, 438/238, 520, 526

[56] References Cited

U.S. PATENT DOCUMENTS

| | | | |
|---|---|---|---|
| 4,754,314 | 6/1988 | Scott et al. | 357/42 |
| 4,810,664 | 3/1989 | Kamins et al. | 437/26 |
| 4,829,359 | 5/1989 | O et al. | 357/42 |
| 5,422,296 | 6/1995 | Lage | 437/52 |

FOREIGN PATENT DOCUMENTS 63-192266  8/1988  Japan.

Primary Examiner—H. Jey Tsai

[57] ABSTRACT

A CMOS SRAM cell in which a patterned SIMOX layer forms a buried oxide beneath the PMOS devices, but not beneath the NMOS devices. Latchup is impossible, and well diffusions are not needed.

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 10–25 is confirmed.

Claims 1, 2, 9 are determined to be patentable as amended.

Claims 3–8, dependent on an amended claim, are determined to be patentable.

1. An integrated circuit fabrication method, comprising the steps of:
   (a.) providing substantially monolithic semiconductor material having an upper surface;
   (b.) selectively forming, *by a process that includes an annealing step,* a buried dielectric layer beneath said upper surface and underlying first, but not second, monocrystalline portions of said semiconductor material;
   (c.) *forming field dielectric regions to separate portions of said semiconductor material, wherein said field dielectric regions define active areas of semiconductor material therebetween; said field dielectric regions extending down into said semiconductor material at least to the depth of said buried dielectric layer;*
   [(c.)] (*d.*) introducing dopants of a first conductivity type into said first monocrystalline portions to form source and drain regions of field effect transistors of a first conductivity type in said first monocrystalline portions, said source and drain regions extending entirely through said first monocrystalline portions, said source and drain regions extending entirely through said first monocrystalline portions to abut said buried dielectric layer; and
   [(d.)] (*e.*) introducing dopants of a second conductivity type into said second monocrystalline portions to form source and drain regions of field effect transistors of a second conductivity type in said second monocrystalline portions.

2. The method of claim 1, wherein said buried dielectric layer is formed by implantation of an oxidizing species followed by *said* annealing *step*.

9. The method of claim 1, [further comprising the additional step, after said step (b.), of forming field dielectric regions to separate portions of said semiconductor material, wherein said field dielectric regions define active areas of said semiconductor material therebetween; said field dielectric regions extending down into said semiconductor material at least to the depth of said buried dielectric layer; and] wherein the portion of the monolithic semiconductor material immediately beneath said buried dielectric layer is entirely of the first conductivity type.

* * * * *